(12) United States Patent
Wu et al.

(10) Patent No.: US 10,466,576 B2
(45) Date of Patent: Nov. 5, 2019

(54) METHOD FOR CONTROLLING PROJECTOR AND ASSOCIATED ELECTRONIC DEVICE

(71) Applicant: HIMAX TECHNOLOGIES LIMITED, Tainan (TW)

(72) Inventors: Biing-Seng Wu, Tainan (TW); Kuan-Ming Chen, Tainan (TW); Han-Yi Kuo, Tainan (TW); Li-Chiu Tsai, Tainan (TW); Chih-Yu Chuang, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 16/145,058

(22) Filed: Sep. 27, 2018

(65) Prior Publication Data

US 2019/0121226 A1 Apr. 25, 2019

Related U.S. Application Data

(60) Provisional application No. 62/574,762, filed on Oct. 20, 2017.

(51) Int. Cl.
*G03B 21/20* (2006.01)
*G02B 27/22* (2018.01)
(Continued)

(52) U.S. Cl.
CPC ...... *G03B 21/2033* (2013.01); *G01B 11/2513* (2013.01); *G01R 27/14* (2013.01);
(Continued)

(58) Field of Classification Search
CPC ........ G03B 21/20; G03B 21/28; G01R 27/14; G02B 27/22; H04N 9/31; B32B 17/10; H02H 5/10; H05B 1/02; H05B 3/84
See application file for complete search history.

(56) References Cited

U.S. PATENT DOCUMENTS 3,684,089 A 8/1972 McMeekin
2002/0162966 A1* 11/2002 Yoder ................. G01N 21/9081
250/372

(Continued)

FOREIGN PATENT DOCUMENTS

CN 103748513 A 4/2014
CN 106170735 A 11/2016
(Continued)

OTHER PUBLICATIONS (2002) Optics. In: Benenson W., Harris J.W., Stocker H., Lutz H. (eds) Handbook of Physics. Springer, New York, NY, pp. 67-95.*

*Primary Examiner* — Cara E Rakowski
*Assistant Examiner* — Danell L Owens
(74) *Attorney, Agent, or Firm* — Winston Hsu

(57) ABSTRACT

The present invention provides an electronic device, wherein the electronic device includes a projector and a controller. The projector includes a laser module and a lens module with a cover glass, wherein a laser beam generated from the laser module passes through the lens module to generate a projected image. The controller is coupled to the projector, and is arranged for determining if the cover glass is broken to generate a determination result, and controlling a power of the laser module according to the determination result.

18 Claims, 9 Drawing Sheets

(51) Int. Cl.
*H04N 9/31* (2006.01)
*G01R 27/14* (2006.01)
*G03B 17/54* (2006.01)
*G01B 11/25* (2006.01)

(52) U.S. Cl.
CPC ............ *G02B 27/22* (2013.01); *G03B 17/54* (2013.01); *G03B 21/2086* (2013.01); *H04N 9/3194* (2013.01)

(56) References Cited

U.S. PATENT DOCUMENTS

| | | | | |
|---|---|---|---|---|
| 2009/0141252 A1* | 6/2009 | Kamijima | ............ | H04N 9/3129 353/85 |
| 2010/0157256 A1* | 6/2010 | Itoh | ........................ | G03B 21/10 353/78 |

FOREIGN PATENT DOCUMENTS

| | | | |
|---|---|---|---|
| EP | 2 889 574 A1 | | 7/2015 |
| JP | 2003085660 A | * | 3/2003 |
| JP | 2004-184802 A | | 7/2004 |
| JP | 2004184802 A | * | 7/2004 |
| TW | 201109737 A1 | | 3/2011 |
| TW | 201128288 A1 | | 8/2011 |
| WO | 2016/158174 A1 | | 10/2016 |

\* cited by examiner (a)

Normal (a)

Scratch (b)

Dint (c)

METHOD FOR CONTROLLING PROJECTOR AND ASSOCIATED ELECTRONIC DEVICE

CROSS REFERENCE TO RELATED APPLICATIONS

This application claims the priority of U.S. Provisional Application No. 62/574,762, filed on Oct. 20, 2017, which is included herein by reference in its entirety.

BACKGROUND OF THE INVENTION

1. Field of the Invention

The present invention relates to a projector, and more particularly, to a safety system for the projector.

2. Description of the Prior Art

For obtaining 3D images, an electronic device may use a projector for projecting a special pattern to a surrounding region, and use camera to capture the image having the special pattern, and the captured image is analyzed by a processor to obtain the depth information of the image. This projector used for obtaining the 3D images generally has an infrared laser module supporting high power. Hence, if a cover glass of the projector is broken, a laser beam generated by the laser module may be harmful to a human eye, especially the user may not be aware of it.

SUMMARY OF THE INVENTION

It is therefore an objective of the present invention to provide a method for determining if the cover glass of the projector is broken, and referring to a determination result to control a power/current of the projector, to solve the above-mentioned problems.

According to one embodiment of the present invention, an electronic device including a projector and a controller is provided. The projector includes a laser module and a lens module with a cover glass, wherein a laser beam generated from the laser module passes through the lens module to generate a projected image. The controller is coupled to the projector, and is arranged for determining if the cover glass is broken to generate a determination result, and controlling a power of the laser module according to the determination result.

According to another embodiment of the present invention, a method for controlling a projector is provided, wherein the projector comprises a laser module and a lens module with a cover glass, and the method comprises the steps of: using the laser module to generate a laser beam, wherein the laser beam passes through the lens module to generate the projected image; determining if the cover glass is broken to generate a determination result; and controlling a power of the laser module according to the determination result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
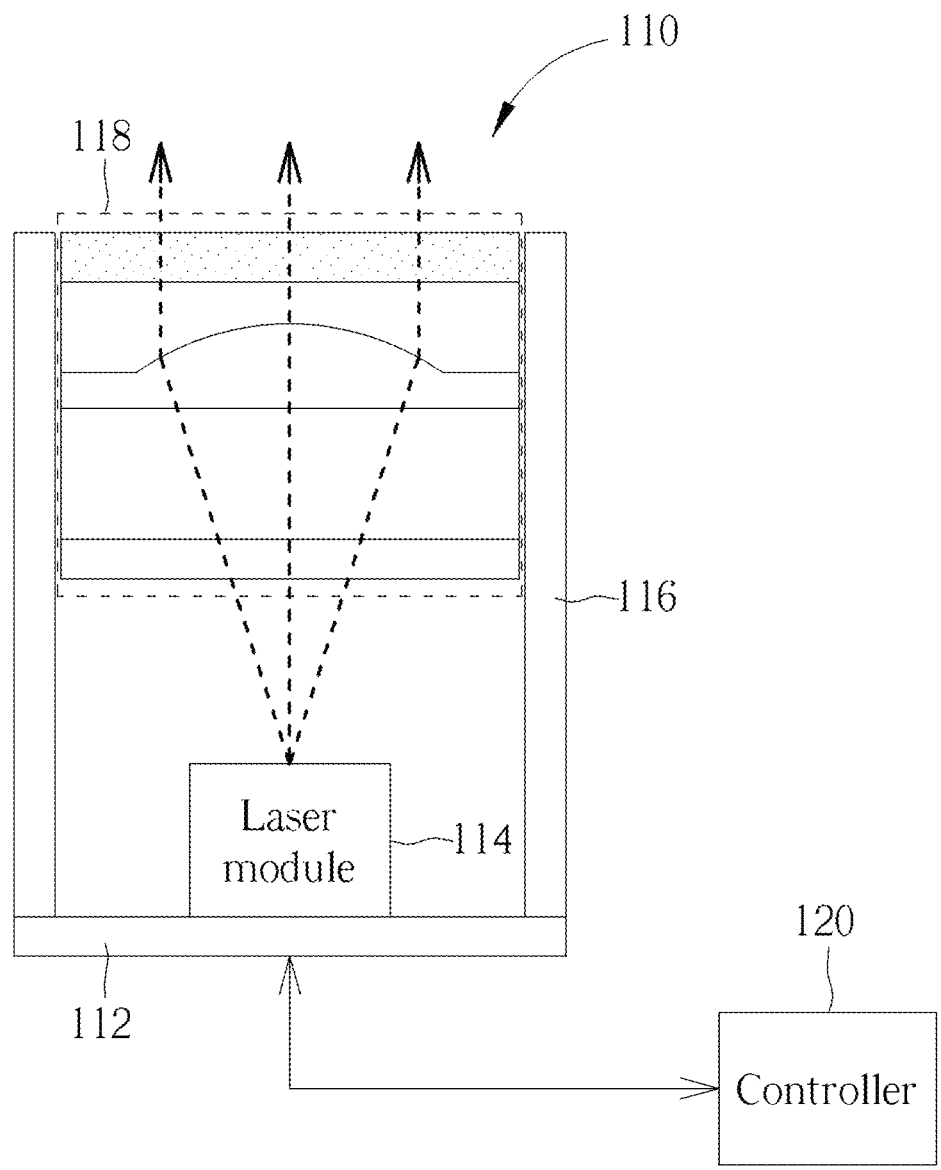
FIG. 1 is a diagram illustrating a system according to one embodiment of the present invention.

FIG. 1 is a diagram illustrating a system according to one embodiment of the present invention. As shown in FIG. 1, the system comprises a projector 110 and a controller 120, where the projector 110 comprises a substrate 110, a laser module 114, a holder 116 and a lens module 118. In this embodiment, the projector 110 is arranged to project an image with a special pattern, and the projector 110 is positioned in an electronic device such as a smart phone or a pad.

The laser module 114 may be a package having an infrared laser diode for emitting infrared laser beam, and the laser module 114 is bonded or adhered on the substrate 112. The laser beam generated by the laser module 114 passes through the lens module 118 to generate a projected image. In this embodiment, the substrate 112 may have a plurality of electrical pads for communicating with the controller 120, and the controller 120 may determine if a cover glass of the lens module 118 is broken or has scratch or dints to generate a determination result, and the controller further refers to the determination result to control a power or a current of the laser module 114. For example, if the controller 120 determines that the cover glass of the lens module 118 is broken or has the scratch or dints, the controller 120 may lower the power of the laser module 114, to prevent a person from being seeing the laser beam having high power.

Figure 2:
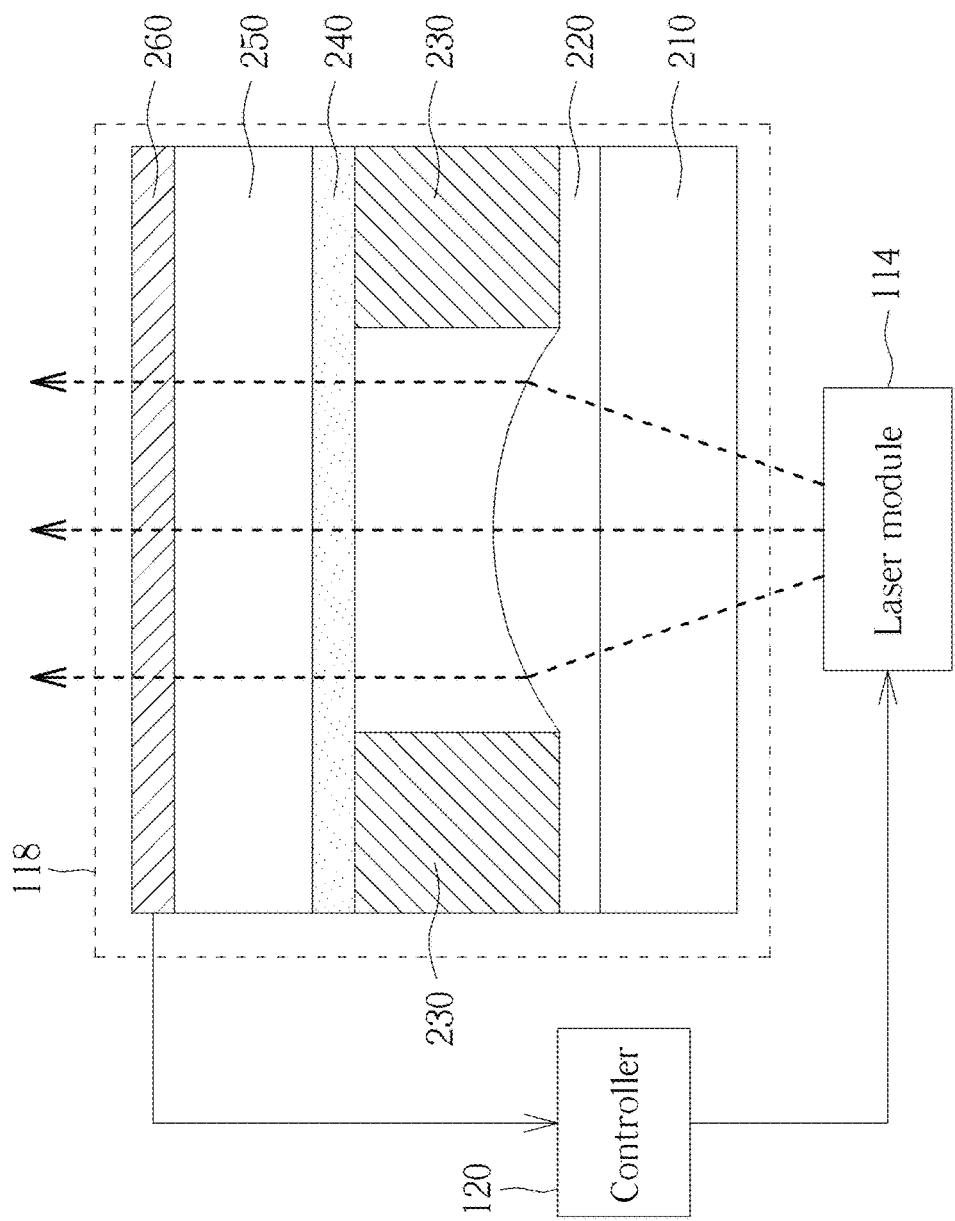
FIG. 2 is a diagram illustrating the laser module, the lens module and the controller according to one embodiment of the present invention.

FIG. 2 is a diagram illustrating the laser module 114, the lens module 118 and the controller 120 according to one embodiment of the present invention. As shown in FIG. 2, the lens module 118 comprises a substrate 210, a convex collimator lens 220 imprinted on a surface of the substrate 210, a cover glass 250, a diffractive optical element (DOE) 240 imprinted on a surface of the cover glass 250, a conductive layer 260 manufactured on the other surface of the cover glass 250, and spacers 230. For the operations of elements shown in FIG. 2, the convex collimator lens 220 is arranged to receive the laser beam from the laser module 114 to generate a collimated laser beam (parallel rays), where the collimated laser beam is substantially perpendicular to the surface of the cover glass 250 and the DOE 240. The DOE 240 can serve as a pattern generator, and the collimated laser beam directly passes through the DOE 240 to generate the projected image, where the projected image may have a special pattern set by the DOE 240. In addition, the controller 120 determines a resistance of the cover glass 250 by determining a resistance of the conductive layer 260 to generate the determination result, and the controller 120 refers to the determination result to control/adjust the power of the laser module 114. Specifically, when the controller 120 determines that the resistance of the cover glass 250 becomes larger (e.g. greater than a threshold value), the controller 120 may determine that the cover glass 250 is broken or cracked, and the controller 120 controls the laser module 114 to generate the laser beam with the lower power, or the controller 120 directly turns off the laser module 114.

In one embodiment, the DOE 240 may be manufactured with the conductive layer 260, that is the DOE 240 may be implemented by conductive materials. In other words, the conductive layer 260 shown in FIG. 2 may have the DOE pattern, and the DOE 240 may be removed from the lens module 118.

Figure 3:
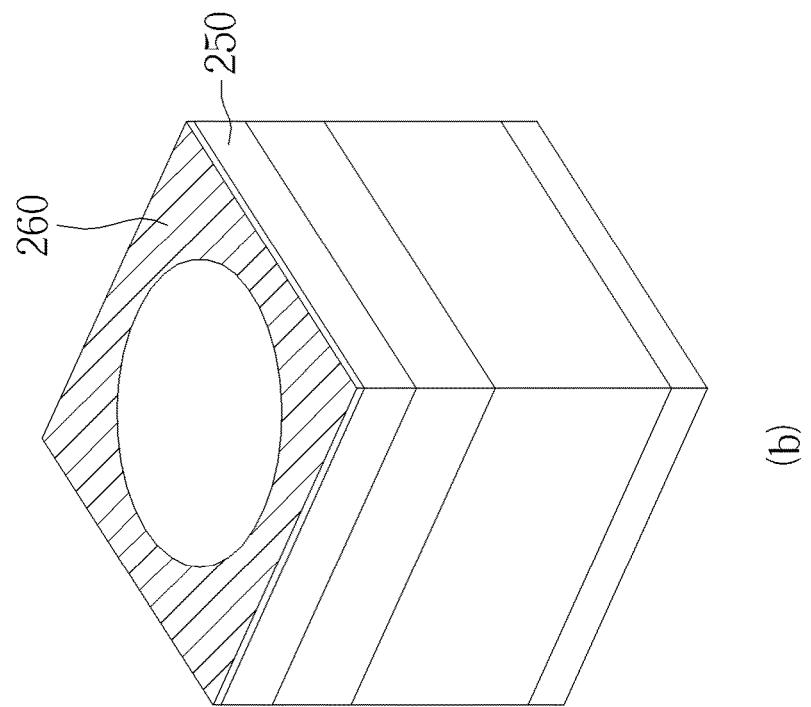
FIG. 3 shows the conductive layer according to the embodiments of the present invention.
Figure 3:
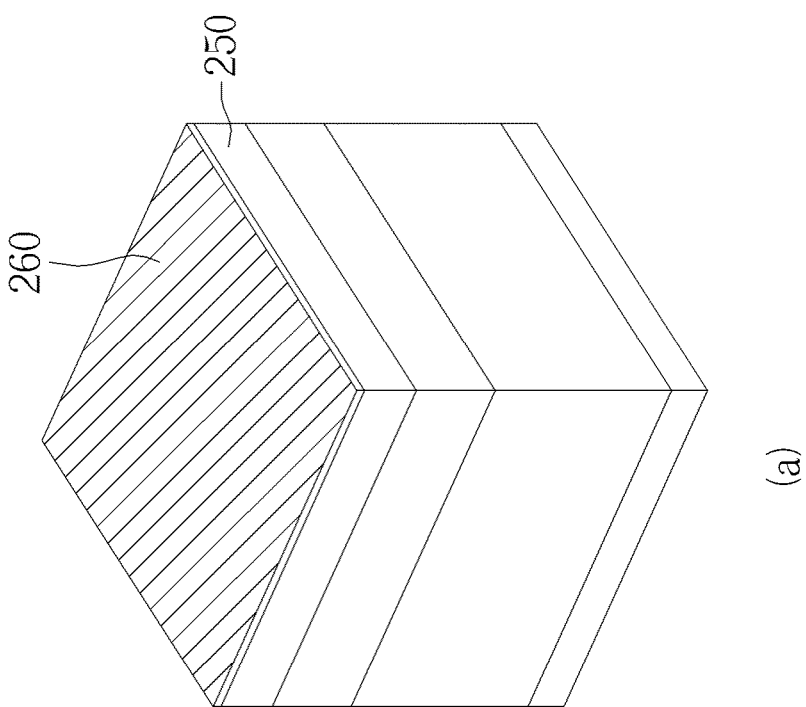

FIG. 3 shows the conductive layer 260 according to the embodiments of the present invention. As shown in FIG. 3(*a*), the conductive layer 260 may be a transparent conductive coating such as indium tin oxide (ITO), indium zinc oxide (IZO) or any suitable transparent material (s), and the conductive layer 260 is manufactured on the whole area of the cover glass 250. In FIG. 3(*b*), the conductive layer 260 is manufactured on the surrounding area of the cover glass 250, and the conductive layer 260 may be transparent or nontransparent conductive coating such as ITO, IZO, chromium or any suitable material(s).

In the embodiments shown in FIG. 3, the conductive layer 260 is manufactured on the supper surface of the cover glass 250, and the DOE 240 is imprinted on the lower surface of the cover glass 250, however, it's not a limitation of the present invention. In other embodiments, the conductive layer 260 may be coated on the lower surface while the DOE 240 is imprinted on the upper surface of the cover glass 250.

Figure 4:
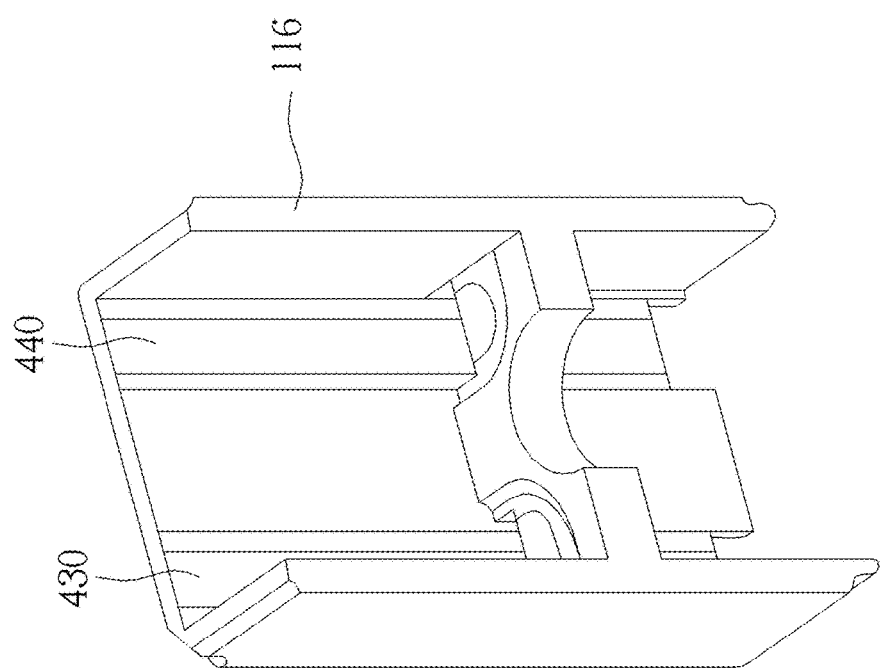
FIG. 4 shows the lens module and the holder according to one embodiment of the present invention.
Figure 4:
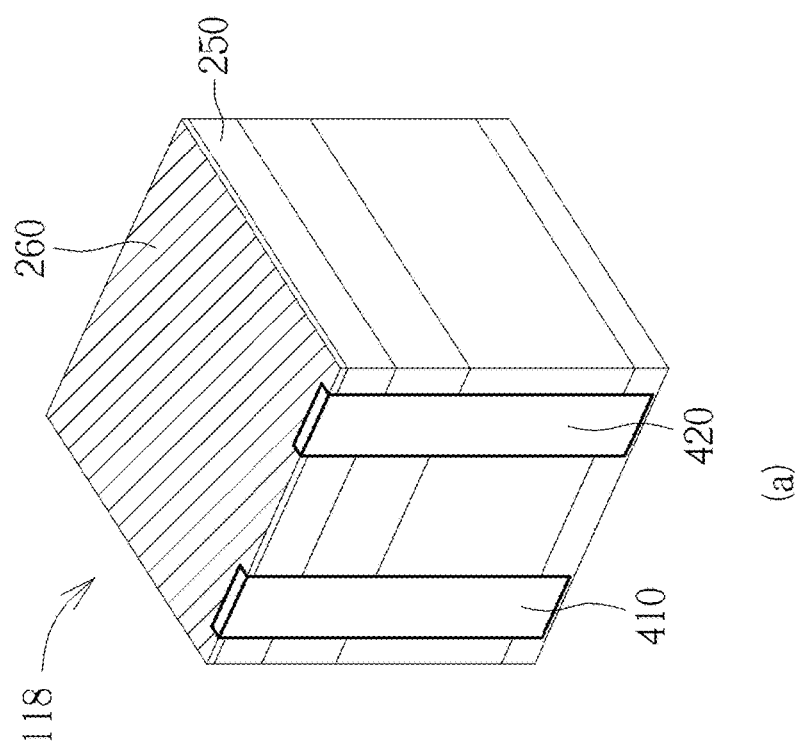

FIG. 4 shows the lens module 118 and the holder 116 according to one embodiment of the present invention. As shown in FIG. 4, a side wall of the lens module 118 has two electrodes 410 and 420, and an inner wall of the holder 116 has two electrodes 430 and 440 connecting to the electrodes 410 and 420, respectively. The controller 120 may couple to the electrodes 430 and 440, and detect the resistance of the cover glass 250 by using a voltage difference between the 430 and 440 and a current flowing through the 430 and 440.

It is noted that the pattern of the conductive layer 260 shown in FIG. 3 and the electrode designs shown in FIG. 4 are for illustrative purposes only. As long as the controller 120 can couple to the conductive layer 260 to detect the resistance of the cover glass 250, the pattern of the conductive layer 260 and the electrodes within the lens module 116 or the holder 116 may have different designs. These alternative designs shall fall within the scope of the present invention.

Figure 5:
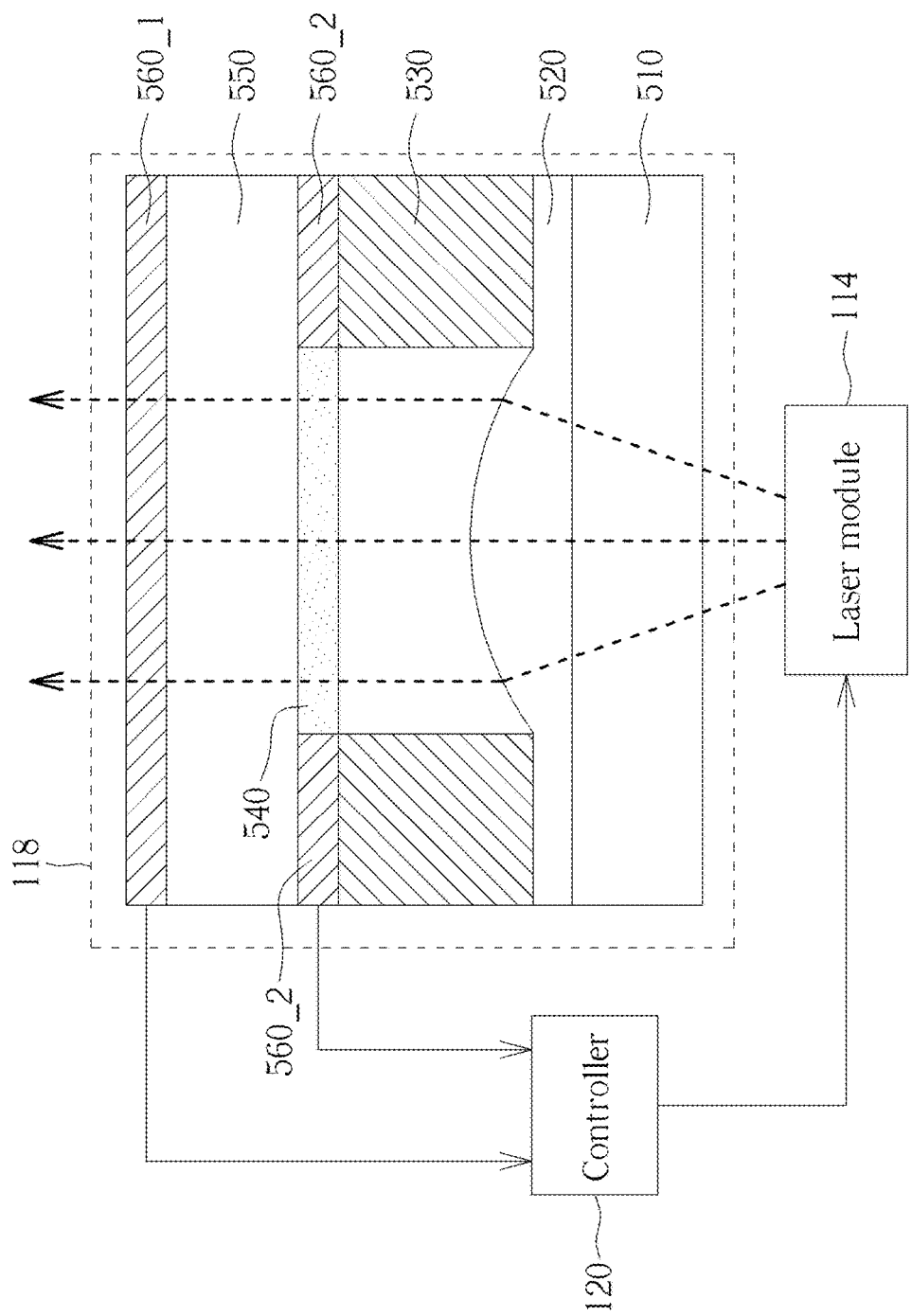
FIG. 5 is a diagram illustrating the laser module, the lens module and the controller according to another embodiment of the present invention.

FIG. 5 is a diagram illustrating the laser module 114, the lens module 118 and the controller 120 according to another embodiment of the present invention. As shown in FIG. 5, the lens module 118 comprises a substrate 510, a convex collimator lens 520 imprinted on a surface of the substrate 510, a cover glass 550, a DOE 540 imprinted on a surface of the cover glass 550, spacers 530, and conductive layers 560_1 and 560_2 manufactured on the two surface of the cover glass 250, respectively. For the operations of elements shown in FIG. 5, the convex collimator lens 520 is arranged to receive the laser beam from the laser module 514 to generate a collimated laser beam (parallel rays), where the collimated laser beam is substantially perpendicular to the surface of the cover glass 550 and the DOE 540. The DOE 540 can serve as a pattern generator, and the collimated laser beam directly passes through the DOE 540 to generate the projected image, where the projected image may have a special pattern set by the DOE 540. In addition, the controller 120 determines a capacitance of the cover glass 550 by determining a capacitance between the conductive layer 560_1 and 560_2 to generate the determination result, and the controller 120 refers to the determination result to control/adjust the power of the laser module 114. Specifically, when the controller 120 determines that the capacitance of the cover glass 550 is not within a range, the controller 120 may determine that the cover glass 550 is broken or cracked, and the controller 120 controls the laser module 114 to generate the laser beam with lower power, or the controller 120 directly turns off the laser module 114.

Figure 6:
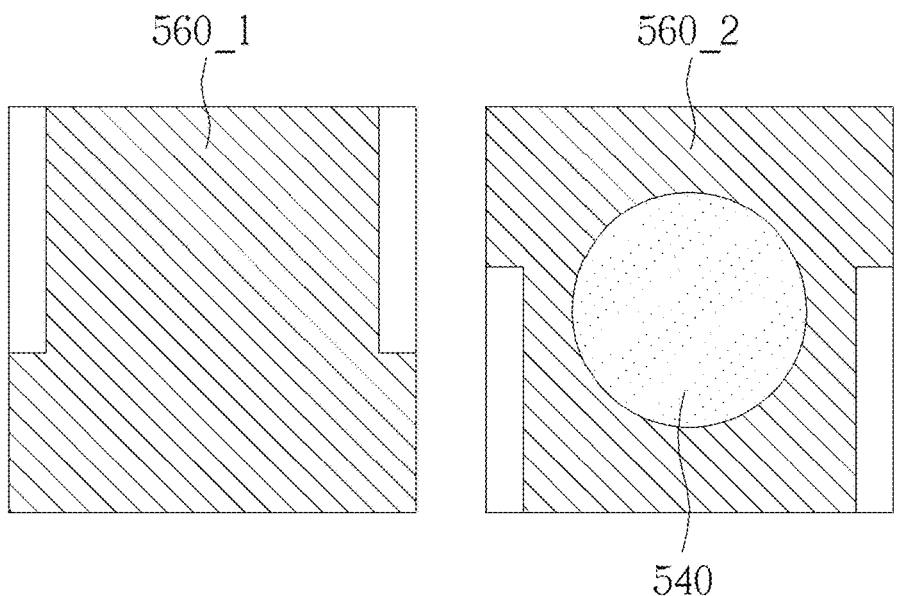
FIG. 6 is a diagram illustrative the two surface of the cover glass according to one embodiment of the present invention.

FIG. 6 is a diagram illustrative the two surface of the cover glass 550 according to one embodiment of the present invention. As shown in FIG. 6, the conductive layer 560_1 may be a transparent conductive coating such as ITO, IZO or any suitable transparent material(s), and the conductive layer 560_1 is manufactured on the whole area of one surface of the cover glass 550 or most area of the cover glass 550. The conductive layer 560_2 is manufactured on the surrounding area of the other surface of the cover glass 550, and the conductive layer 560_2 may be transparent or nontransparent conductive coating such as ITO, IZO, chromium or any suitable material(s). In addition, the center region of the other surface of the cover glass 550 has the DOE 540 to make the projected image have the special pattern set by the DOE 540.

Figure 7:
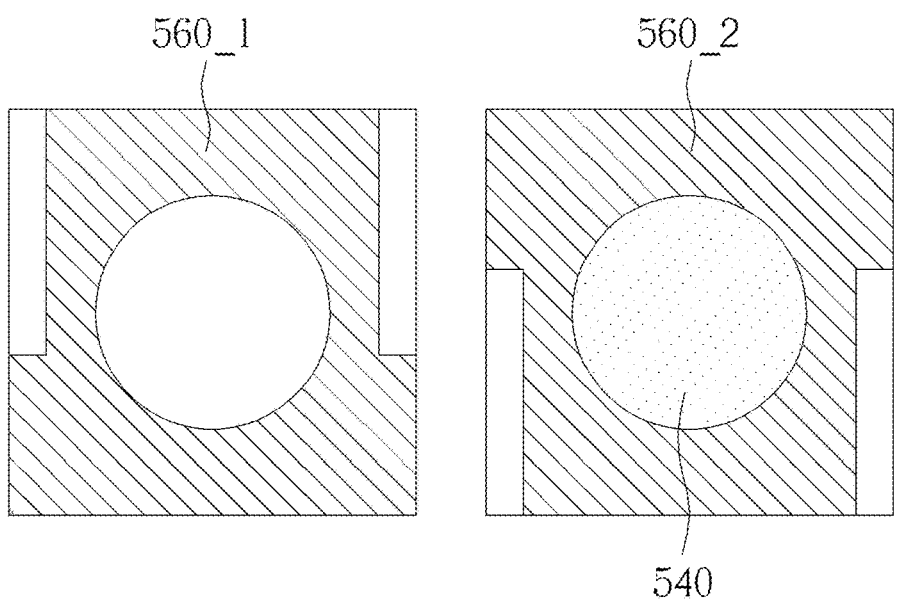
FIG. 7 is a diagram illustrative the two surface of the cover glass according to another embodiment of the present invention.

FIG. 7 is a diagram illustrative the two surface of the cover glass 550 according to another embodiment of the present invention. As shown in FIG. 7, the conductive layer 560_1 may be a transparent or nontransparent conductive coating such as ITO, IZO, chromium or any suitable material(s), and the conductive layer 560_1 is manufactured on the surrounding area of one surface of the cover glass 550. The conductive layer 560_2 is manufactured on the surrounding area of the other surface of the cover glass 550, and the conductive layer 560_2 may be transparent or nontransparent conductive coating such as ITO, IZO, chromium or any suitable material(s). In addition, the center region of the other surface of the cover glass 550 has the DOE 540 to make the projected image have the special pattern set by the DOE 540.

It is noted that the pattern of the conductive layers 560_1 and 560_2 shown in FIG. 5 are for illustrative purposes only. As long as the controller 120 can couple to the conductive layers 560_1 and 560_2 to detect the capacitance of the cover glass 550, the pattern of the conductive layers 560_1 and 560_2 may have different designs. For example, both the conductive layers 560_1 and 560_2 may be coated on the upper surface of the cover glass 550, or the both the conductive layers 560_1 and 560_2 may be coated on the lower surface of the cover glass 550. These alternative designs shall fall within the scope of the present invention.

In the embodiments shown in FIG. 7, the DOE 540 is imprinted on the lower surface of the cover glass 550, however, it's not a limitation of the present invention. In other embodiments, the DOE 540 may be imprinted on the center region of the upper surface of the cover glass 550.

In addition, the holder 116 shown in FIG. 4 can be used to hold the lens module 118, and the electrodes 430 and 440 are coupled to the conductive layers 560_1 and 560_2, respectively. The controller 120 may couple to the conductive layers 560_1 and 560_2 via the electrodes 430 and 440, respectively, to detect capacitance of the cover glass 550.

Figure 8:
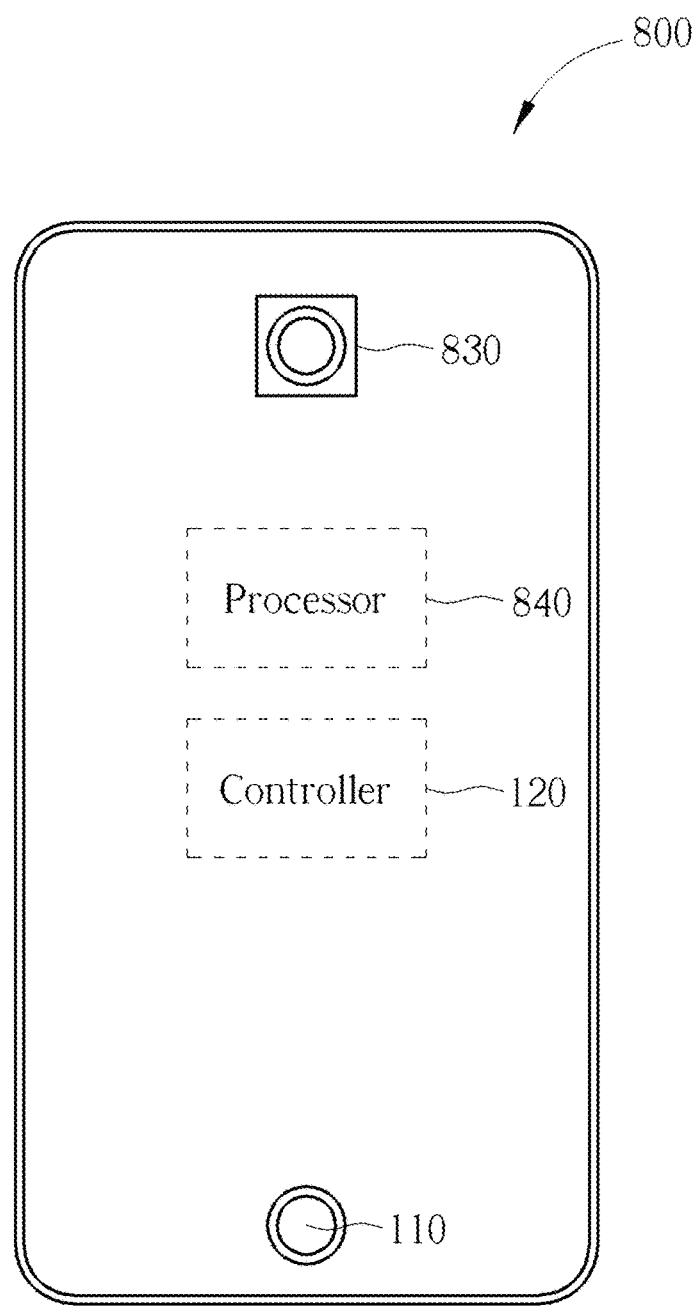
FIG. 8 is a diagram illustrating an electronic device according to one embodiment of the present invention.

FIG. 8 is a diagram illustrating an electronic device 800 according to one embodiment of the present invention. As shown in FIG. 8, the electronic device 800 is a smart phone, and the electronic device 800 comprises the projector 110, the controller 120, a camera module 830 and a processor 840. In this embodiment, the 110 is embedded in a back side of the electronic device 800, and is used to project an infrared image with a special pattern to a region of a surrounding environment. Then, the camera module 830 captures the region of the surrounding environment to generate image data. Finally, the processor 840 analyzes the image data to obtain depth information of the image data to generate a 3D image. In addition, the controller 120 continuously detects the resistance/capacitance of the cover glass 250/550 to determine if the cover glass 250/550 is broken or cracked to control the power of the laser module 114 within the projector 110. It is noted that the controller 120 and the processor 840 are used together for the 3D sensing function, and the controller 120 and the processor 840 can be integrated together or implemented by different chips.

Figure 9:
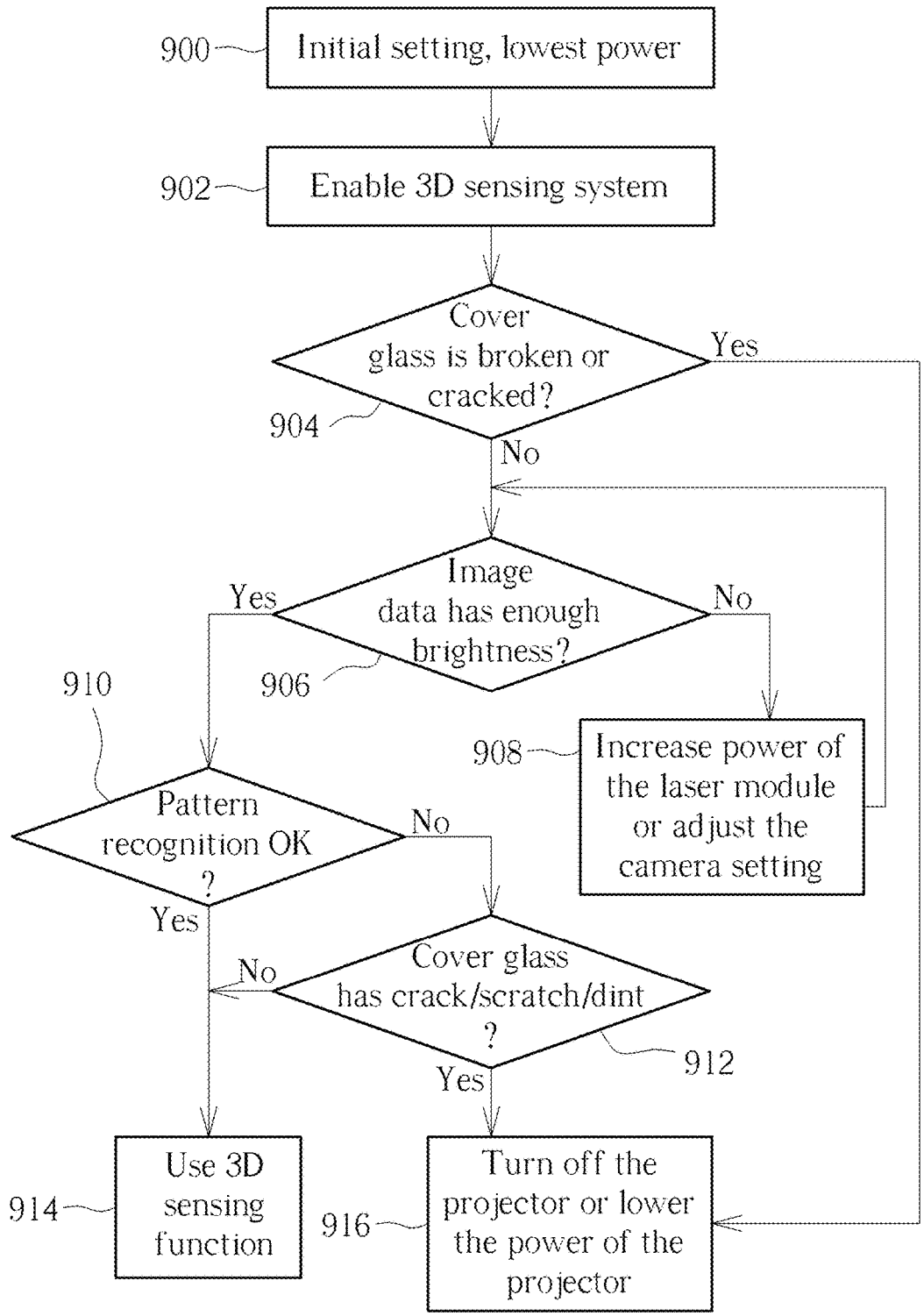
FIG. 9 is flowchart a 3D image sensing operations performed by the electronic device 800 according to one embodiment of the present invention.

FIG. 9 is flowchart a 3D image sensing operations performed by the electronic device 800 according to one embodiment of the present invention. Referring to FIGS. 1-8, the flowchart is as follows.

Step 900: the flow starts, and the projector 110 has an initial setting and the laser module 114 has the lowest power.

Step 902: the processor 540 enables the 3D sensing system to prepare to capture the 3D image.

Step 904: the controller 120 determines if the cover glass 250/550 of the projector 110 is broken/cracked. If yes, the flow enters Step 916; if not, the flow enters Step 906.

Step 906: the projector 110 generates the projected image to the region of the surrounding environment, the camera module 830 captures the region of the surrounding environment to generate image data, and the processor 840 determines if a brightness of the image data is enough. If the brightness of the image data is enough, the flow enters Step 910; if not, the flow enters Step 908.

Step 908: the controller 120 increases the power of the laser module 114 or the processor 840 controls the setting of the camera module 830. Then, the flow enters Step 906.

Step 910: the processor 840 determines if the pattern of the projected image (captured by the camera module 830) can be recognized successfully. It yes, the flow enters Step 914; if not, the flow enters Step 912.

Step 912: the processor 840 analyzes the pattern of the projected image (captured by the camera module 830) to determine if the cover glass 250/550 has crack/scratch/dint. If yes, the flow enters Step 916; if not, the flow enters Step 914.

Step 914: the processor 840 uses the 3D image sensing function to obtain the 3D image.

Step 916: the controller 120 turns off the projector 110 or lowers the power of the laser module 114 (e.g. the laser module 114 has the lowest power similar to the initial setting, and the controller 120 feedbacks the information to the processor 840.

Figure 10:
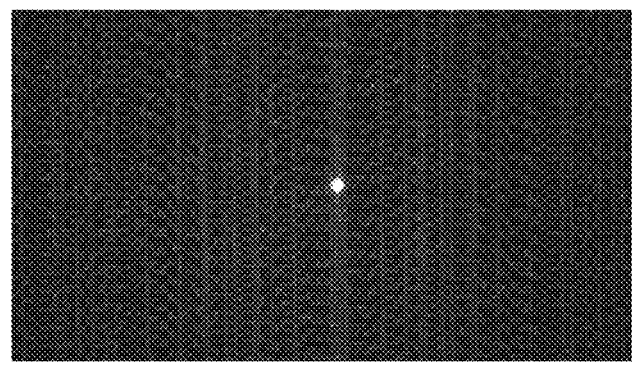
FIG. 10 shows one of the patterns of the projected image when the cover glass is in the normal condition, and the cover glass has the scratch and the dints
Figure 10:
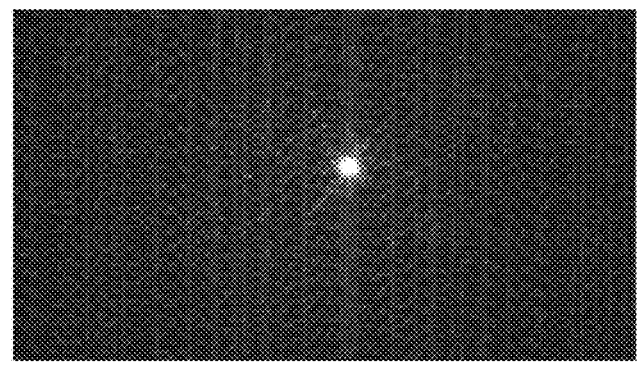
Figure 10:
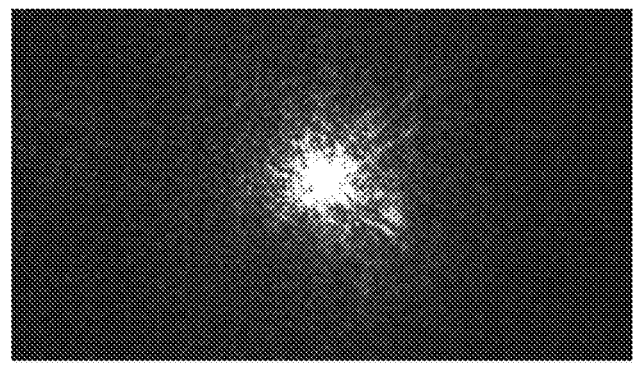

Regarding the Step 912, the processor 840 may analyze a size of a special pattern of the projected image to generate the analysis result for indicating if the cover glass 250/550 has crack/scratch/dint. Taking FIG. 10 as an example, which shows the zero order pattern of projected image (e.g., the brightest spot of the projected image) when the cover glass 250/550 under different conditions. As shown in FIG. 10, the zero order pattern of projected image has a smaller size in a normal condition, and the zero order pattern becomes larger when the cover glass 250/550 has crack/scratch/dint. Therefore, when the processor 840 determines that the size of the zero order pattern is greater than a threshold, the processor 840 can determine that the cover glass 250/550 has crack/scratch/dint. In addition, the processor 840 may further analyze the other recognition information, such as the decode ratio to determine if the cover glass 250/550 has crack/scratch/dint.

Briefly summarized, in the method for controlling the projector of the present invention, the power of the projector can be controlled by referring to the determination result indicating if the cover glass of the projector is broken or cracked. Therefore, the projector can be prevented from generating the projected image with large power when the cover glass detection is failed, to protect the human eye.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
   a projector, comprising:
      a laser module, for generating a laser beam; and
      a lens module with a cover glass, wherein the laser beam from the laser module passes through the lens module to generate a projected image; and
   a controller, coupled to the projector, for determining if the cover glass is broken to generate a determination result, and controlling a power of the laser module according to the determination result; wherein the controller further analyzes a specific image obtained by using a camera to capture the projected image to generate an analysis result, and the controller determines if the cover glass of the projector has crack/scratch/dint to generate another determination result according to the analysis result, and the controller further controls the power of the laser module according to the other determination result.

2. The electronic device of claim 1, wherein when the determination result indicates that cover glass is broken, the controller lowers the power of the laser module.

3. The electronic device of claim 1, wherein when the determination result indicates that cover glass is broken, the controller turns off the laser module.

4. The electronic device of claim 1, wherein the controller detects a resistance of the cover glass to determine if the cover glass is broken to generate the determination result.

5. The electronic device of claim 4, wherein the lens module comprises the cover glass, and one surface of the cover glass has a diffraction optical element (DOE) imprinted thereon, and the other surface of the cover glass has an conductive layer for the resistance detection.

6. The electronic device of claim 1, wherein the controller detects a capacitance of the cover glass to determine if the cover glass is broken to generate the determination result.

7. The electronic device of claim 6, wherein the lens module comprises the cover glass, and both two surfaces of the cover glass have conductive layers for the capacitance detection, and one of the two surfaces has a DOE imprinted thereon.

8. The electronic device of claim 1, wherein the controller determines a size of a pattern of the specific image to generate the analysis result.

9. The electronic device of claim 8, wherein when the size of the pattern of the specific image is greater than a threshold, the controller determines that the cover glass has crack/scratch/dint.

10. A method for controlling a projector, wherein the projector comprises a laser module and a lens module with a cover glass, and the method comprises:
   using the laser module to generate a laser beam, wherein the laser beam passes through the lens module to generate the projected image;
   determining if the cover glass is broken to generate a determination result;
   controlling a power of the laser module according to the determination result;
   analyzing a specific image obtained by using a camera to capture the projected image to generate an analysis result; and
   determining if the cover glass of the projector has crack/scratch/dint to generate another determination result according to the analysis result; and
   controlling the power of the laser module according to the other determination result.

11. The method of claim 10, wherein the step of controlling the power of the laser module according to the determination result comprises:
   when the determination result indicates that cover glass is broken, lowering the power of the laser module.

12. The method of claim 10, wherein the step of controlling the power of the laser module according to the determination result comprises:
   when the determination result indicates that cover glass is broken, turning off the laser module.

13. The method of claim 10, wherein the step of determining if the cover glass is broken to generate the determination result comprises:
   detecting a resistance of the cover glass to determine if the cover glass is broken to generate the determination result.

14. The method of claim 13, wherein the lens module comprises the cover glass, and one surface of the cover glass has a diffraction optical element (DOE) imprinted thereon, and the other surface of the cover glass has an conductive layer for the resistance detection.

15. The method of claim 10, wherein the step of determining if the cover glass is broken to generate the determination result comprises:
   detecting a capacitance of the cover glass to determine if the cover glass is broken to generate the determination result.

16. The method of claim 15, wherein the lens module comprises the cover glass, and both two surfaces of the cover glass have conductive layers for the capacitance detection, and one of the two surfaces has a DOE imprinted thereon.

17. The method of claim 10, wherein the step of analyzing the specific image obtained by using the camera to capture the projected image to generate the analysis result comprises:
   determining a size of a pattern of the specific image to generate the analysis result.

18. The method of claim 17, wherein the step of determining if the cover glass has crack/scratch/dint according to the analysis result comprises:
   when the size of the pattern of the specific image is greater than a threshold, determining that the cover glass has crack/scratch/dint.

* * * * *